US012650473B2

(12) United States Patent (10) Patent No.: US 12,650,473 B2
Jeong et al. (45) Date of Patent: *Jun. 9, 2026

(54) BATTERY MANAGEMENT SYSTEM AND BATTERY MANAGEMENT METHOD

(71) Applicant: SK On Co., Ltd., Seoul (KR)

(72) Inventors: Doo Jin Jeong, Daejeon (KR); Jeong Min Seo, Daejeon (KR); Kyu Min Hwang, Daejeon (KR); Byung Eun Lee, Daejeon (KR)

(73) Assignee: SK On Co., Ltd., Seoul (KR)

( * ) Notice: Subject to any disclaimer, the term of this patent is extended or adjusted under 35 U.S.C. 154(b) by 334 days.

This patent is subject to a terminal disclaimer.

(21) Appl. No.: 18/472,397

(22) Filed: Sep. 22, 2023

(65) Prior Publication Data

US 2024/0012067 A1 Jan. 11, 2024

Related U.S. Application Data

(63) Continuation of application No. 17/198,401, filed on Mar. 11, 2021, now Pat. No. 11,796,601.

(30) Foreign Application Priority Data

Mar. 12, 2020 (KR) ........................ 10-2020-0030806

(51) Int. Cl.
| | |
|---|---|
| *H01M 10/42* | (2006.01) |
| *G01R 31/382* | (2019.01) |
| *G01R 31/392* | (2019.01) |
| *G01R 31/396* | (2019.01) |

(52) U.S. Cl.
CPC ......... *G01R 31/392* (2019.01); *G01R 31/382* (2019.01); *G01R 31/396* (2019.01); *H01M 10/4257* (2013.01); *H01M 2010/4271* (2013.01)

(58) Field of Classification Search
CPC .. G01R 31/382; G01R 31/387; G01R 31/392; G01R 31/396; H01M 10/4257; H01M 2010/4271; H02J 7/0013; H02J 7/0048; H02J 7/005; Y02E 60/10
See application file for complete search history.

(56) References Cited

U.S. PATENT DOCUMENTS

| | | | |
|---|---|---|---|
| 2015/0214761 | A1 | 7/2015 | Kono et al. |
| 2015/0258897 | A1 | 9/2015 | Okada et al. |
| 2022/0082630 | A1 | 3/2022 | Takaoka et al. |

FOREIGN PATENT DOCUMENTS

| | | |
|---|---|---|
| JP | 5040731 B2 | 10/2012 |
| JP | 5931705 B2 | 6/2016 |
| JP | 5932596 B2 | 6/2016 |
| JP | 6184815 B2 | 8/2017 |
| JP | 6589080 B1 | 10/2019 |
| KR | 101073277 B1 | 10/2011 |
| KR | 1020130110355 A | 10/2013 |

*Primary Examiner* — Victoria H Lynch
(74) *Attorney, Agent, or Firm* — The Webb Law Firm

(57) ABSTRACT

Provided are a battery management system and a battery management method using the same. According to the present invention, it is possible to select high-risk battery cells that are highly likely to be out of an operating voltage range by applying a change amount according to SoH for each of the battery cells to each SoC for each of the battery cells, and calculate the representative SoH of the battery pack based on the selected high-risk battery cells, and then calculate the actual usable capacity of the battery pack.

4 Claims, 7 Drawing Sheets

<CASE OF IDEAL BATTERY PACK>

BATTERY MANAGEMENT SYSTEM AND BATTERY MANAGEMENT METHOD

CROSS-REFERENCE TO RELATED APPLICATIONS

This application is a continuation of U.S. patent application Ser. No. 17/198,401, filed Mar. 11, 2021, which claims priority to Korean Patent Application No. 10-2020-0030806 filed Mar. 12, 2020, the disclosures of which are hereby incorporated by reference in their entirety.

BACKGROUND OF THE INVENTION

Field of the Invention

The following disclosure relates to a battery management system capable of selecting high-risk battery cells that are likely to be out of an operating voltage range among a plurality of battery cells constituting a battery pack, and calculating an actual usable capacity of the battery pack based on the selected battery cells, and a battery management method using the same.

Description of Related Art

As a general method for estimating a battery state (state of charge (SoC), state of health (SoH), internal resistance, etc.) used in a battery management system (BMS) of an electric vehicle, there is a method of determining a battery state by selecting a representative voltage of a battery pack that represents a plurality of battery cells.

The battery management system calculates a current limit value at which the battery can be charged and discharged between an upper limit voltage during charging and a lower limit voltage during discharging using the determined battery state. This is because if the voltage of the battery cell is repeatedly out of a boundary between the upper and lower limit voltages, that is, the operating voltage range during the charging and discharging, the battery cell deteriorates, and thus the battery life is adversely affected. However, in the actual battery pack, there is a deviation in the state of the respective battery cells from the beginning of production. The deviation may further increase as the electric vehicle is driven. When the deviation between the battery cells increases in this way, an error also increases in the estimation of the battery state using the representative voltage of the plurality of battery cells.

FIG. 1A illustrates a change in a terminal voltage over time in the case of an ideal battery pack. Referring to FIG. 1A, since each battery cell included in the ideal battery pack has the same internal resistance, current capacity, etc., and thus has a constant rate of decrease in the terminal voltage over time to have the same terminal voltage, there is no problem in determining the battery state using any one battery cell or an average voltage of the battery cells as a representative voltage.

In contrast, FIG. 1B illustrates a change in the terminal voltage over time in the case of the actual battery pack. Referring to FIG. 1B, since each battery cell included in the actual battery pack has different internal resistance, current capacity, etc., and thus has a different rate of decrease in the terminal voltage over time, an error occurs when simply estimating the battery state using any one battery cell or the average voltage of the battery cells as the representative voltage.

If an error occurs when estimating the battery state, an error occurs even when calculating a current limit value based on the state estimation. In this case, battery cells that are out of the operating voltage range and continuously deteriorate may occur during the charging and discharging, and thus the overall efficiency of the battery pack may be reduced and the stability of the battery pack may be reduced, thereby causing the risk that the electric vehicle stops while driving.

Therefore, in order to prevent this, there is a need to grasp the state of each of the plurality of battery cells constituting the battery pack, and select and specially manage high-risk battery cells that are likely to deteriorate by first reaching the upper or lower limit of the operating voltage among the battery cells.

RELATED ART DOCUMENT

Patent Document

Korean Patent Laid-Open Publication No. 10-2013-0110355

SUMMARY OF THE INVENTION

An embodiment of the present invention is directed to providing a system and method of selecting a high-risk battery cell which is likely to deteriorate by first reaching an upper or lower limit value of an operating voltage among a plurality of battery cells.

Another embodiment of the present invention is directed to providing an system and method capable of calculating an actual usable capacity of a battery pack.

In one general aspect, a battery management system for selecting, from a plurality of battery cells constituting a battery pack, a high-risk battery cell that has a risk that a terminal voltage during charging or a terminal voltage during discharging is out of an operating voltage, includes: a state information calculator that calculates state information of each of the plurality of battery cells; and a cell selector that selects the high-risk battery cell using the state information, in which the state information calculated by the state information calculator includes at least one of a state of charge (SoC) and a state of health (SoH), and the cell selector selects the high-risk battery cell by using the state information of at least one of the SoC of each of the battery cells and the SoH of each of the battery cells at a current measurement time point.

The cell selector may select the high-risk battery cell by applying a change amount of the SoC according to the SoH of each of the battery cells to the SoC of each of the battery cells at the current measurement time point.

The cell selector may select a battery cell to be fully charged first as the high-risk battery cell when applying the change amount of the SoC according to the SoH of each of the battery cells based on the SoC of each of the battery cells at the current measurement time point, and selects a battery cell to be fully discharged first as the high-risk battery cell when applying the change amount of the SoC according to the SoH of each of the battery cells based on the SoC of each of the battery cells at the current measurement time point.

The cell selector may select a battery cell having the lowest SoH among the battery cells as the high-risk battery cell.

When a current flows into the selected high-risk battery cell at 1 C-rate based on the initial usable capacity of the battery cells, the cell selector may calculate a representative SoH of the battery pack by applying the following Equation 1 to K which is a summed value of a time from the current measurement time point until the battery cell to be fully discharged first is fully discharged and a time from the current measurement time point until the battery cell to be fully charged first is fully charged.

$$SoH_{pack}=K \times 100 \qquad \text{[Equation 1]}$$

(Here, $SoH_{pack}$ is the representative SoH of the battery pack, and the unit of K is time (hr))

The battery management system may further include: a capacity calculator that calculates the actual usable capacity of the battery pack, in which the actual usable capacity of the battery pack calculated by the capacity calculator may be calculated through the following Equation 2.

$$CP_{pack}=SoH_{pack} \times CP_{BOL} \qquad \text{[Equation 2]}$$

(Here, $CP_{pack}$ is the actual usable capacity of the battery pack, $SoH_{pack}$ is the representative SoH of the battery pack, and $CP_{BOL}$ is the initial usable capacity of the battery cell)

In another general aspect, a battery management method using a battery management system for selecting, from a plurality of battery cells constituting a battery pack, a high-risk battery cell that has a risk that a terminal voltage during charging or a terminal voltage during discharging is out of an operating voltage, includes: calculating state information of each of the plurality of battery cells; and selecting the high-risk battery cell using the state information, wherein the state information includes at least one of SoC and SoH, and in the selecting of the high-risk battery cell, the high-risk battery cell is selected by using the state information of at least one of the SoC of each of the battery cells and the SoH of each of the battery cells at a current measurement time point.

In the selecting of the high-risk battery cell, the high-risk battery cell may be selected by applying a change amount of the SoC according to the SoH of each of the battery cells to the SoC of each of the battery cells at the current measurement time point.

In the selecting of the high-risk battery cell, a battery cell to be fully charged first may be selected as the high-risk battery cell when applying the change amount of the SoC according to the SoH of each of the battery cells based on the SoC of each of the battery cells at the current measurement time point, and a battery cell to be fully discharged first may be selected as the high-risk battery cell when applying the change amount of the SoC according to the SoH of each of the battery cells based on the SoC of each of the battery cells at the current measurement time point.

In the selecting of the high-risk battery cell, a battery cell having a lowest SoH among the battery cells may be selected as the high-risk battery cell.

The battery management method may further include: after the selecting of the high-risk battery cell, calculating a representative SoH of the battery pack by applying the following Equation 3 to K which is a summed value of a time from the current measurement time point until the battery cell to be fully discharged first is fully discharged and a time from the current measurement time point until the battery cell to be fully charged first is fully charged, when a current flows into the selected high-risk battery cell at 1 C-rate based on the initial usable capacity of the battery cells.

$$SoH_{pack}=K \times 100 \qquad \text{[Equation 3]}$$

(Here, $SoH_{pack}$ is the representative SoH of the battery pack, and the unit of K is time (hr))

The battery management method may further include: after the calculating of the representative SoH of the battery pack, calculating the actual usable capacity of the battery pack through the following Equation 4.

$$CP_{pack}=SoH_{pack} \times CP_{BOL} \qquad \text{[Equation 4]}$$

(Here, $CP_{pack}$ is the actual usable capacity of the battery pack, $SoH_{pack}$ is the representative SoH of the battery pack, and $CP_{BOL}$ is the initial usable capacity of the battery cell)

According to the present invention, the high-risk battery cell that is highly likely to be out of the operating voltage range can be selected by applying the change amount according to the SoH for each of the battery cells to the SoC for each of the battery cells.

In addition, according to the present invention, the representative SoH of the battery pack based on the selected high-risk battery cells is calculated, and then the actual usable capacity of the battery pack can be calculated based on the calculated representative SoH.

DETAILED DESCRIPTION OF MAIN ELEMENTS

Figure 1A:
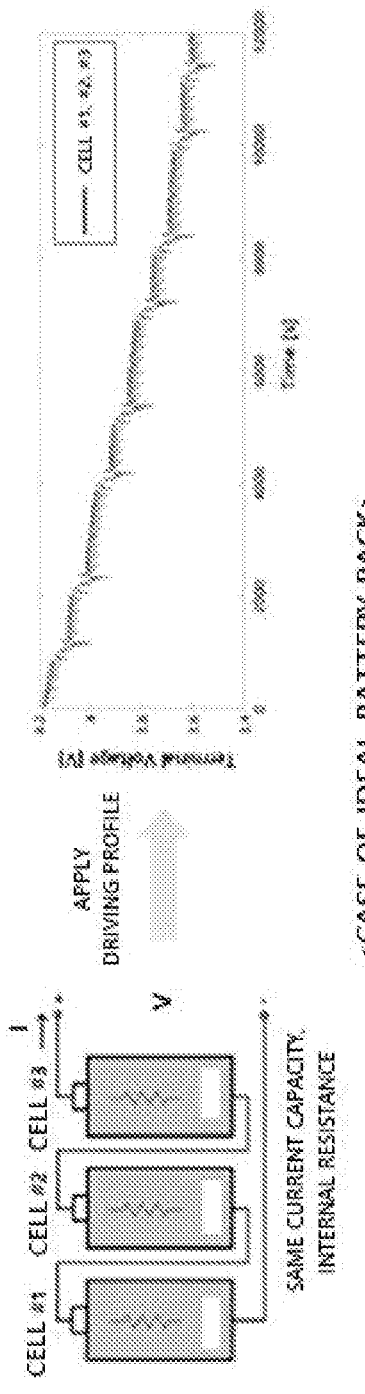
FIG. 1A is a diagram illustrating a change in a terminal voltage of a battery cell, which is included in an ideal battery pack, over time.
Figure 1B:
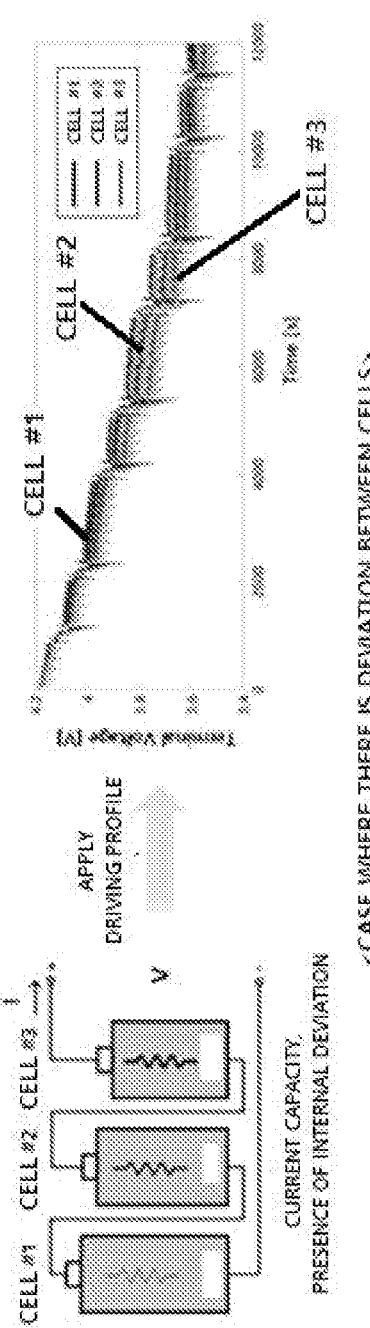
FIG. 1B is a diagram illustrating a change in a terminal voltage of a battery cell, which is included in an actual battery pack, over time.

1: Conventional battery management system
10: Conventional state information calculator
12: Convention current calculator
1000: Battery management system
100: State information calculator
200: Cell selector
300: Capacity calculator
400: Current calculator

DESCRIPTION OF THE INVENTION

Hereinafter, the present invention will be described in detail with reference to the accompanying drawings. In addition, a detailed description for the well-known functions and configurations that may unnecessarily make the gist of the present invention unclear will be omitted.

A term "unit", "module", or the like, described in the specification means a unit of processing at least one function or operation and may be implemented by hardware or software or a combination of hardware and software.

Figure 2:
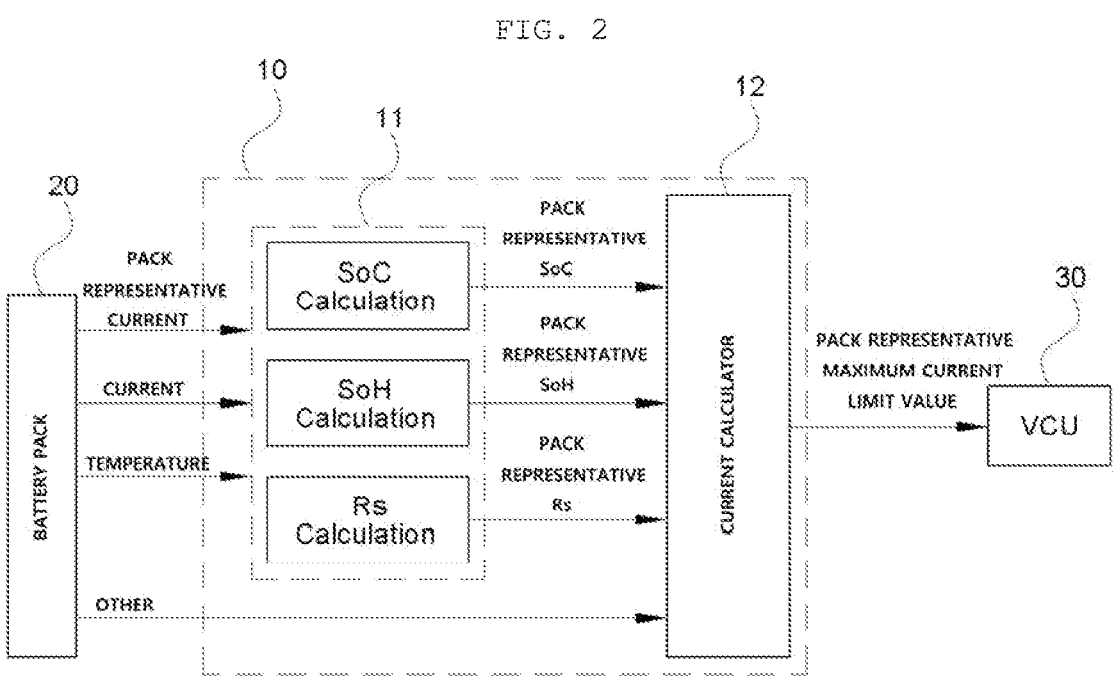
FIG. 2 is a diagram illustrating the conventional battery management system (BMS).

FIG. 2 is a diagram illustrating the conventional battery management system.

Referring to FIG. 2, the conventional battery management system 10 receives a pack representative voltage, current, and temperature from the battery pack 20, and calculates a representative state of charge (SoC) of the battery pack 20, a representative state of health (SoH) of the battery pack 20, and a representative internal resistance Rs of the battery pack 20 in the state information calculator 11. By using the representative SoC, the representative SoH, and the representative internal resistance Rs calculated in this way, the current calculator 12 calculates a current limit value that allows the battery pack 20 to be charged and discharged within the operating voltage range, and the current limit value is transferred to a vehicle control unit (VCU) 30 that may adjust a load to make a current within the current limit value flow into the battery pack 20.

In this case, the load may be an inverter for controlling a motor, a charging device for charging the battery pack 20, or the like.

However, as described above, unlike an ideal battery pack, in the case of an actual battery pack, the internal resistance, the current capacity, and the like of each battery cell included in the battery pack are different from each other, and as a result, reduction rates in a terminal voltage over time are different from each other, and a deviation in the terminal voltage becomes severe over time.

Therefore, for the stability and efficiency of the battery pack, there is a need to select and specially manage high-risk battery cells among battery cells, which are likely to deteriorate by first reaching upper or lower limits of the operating voltage.

In addition, there is a need to select the high-risk battery cells in order to accurately calculate the limit value of the current allowed in the battery pack.

Figure 3:
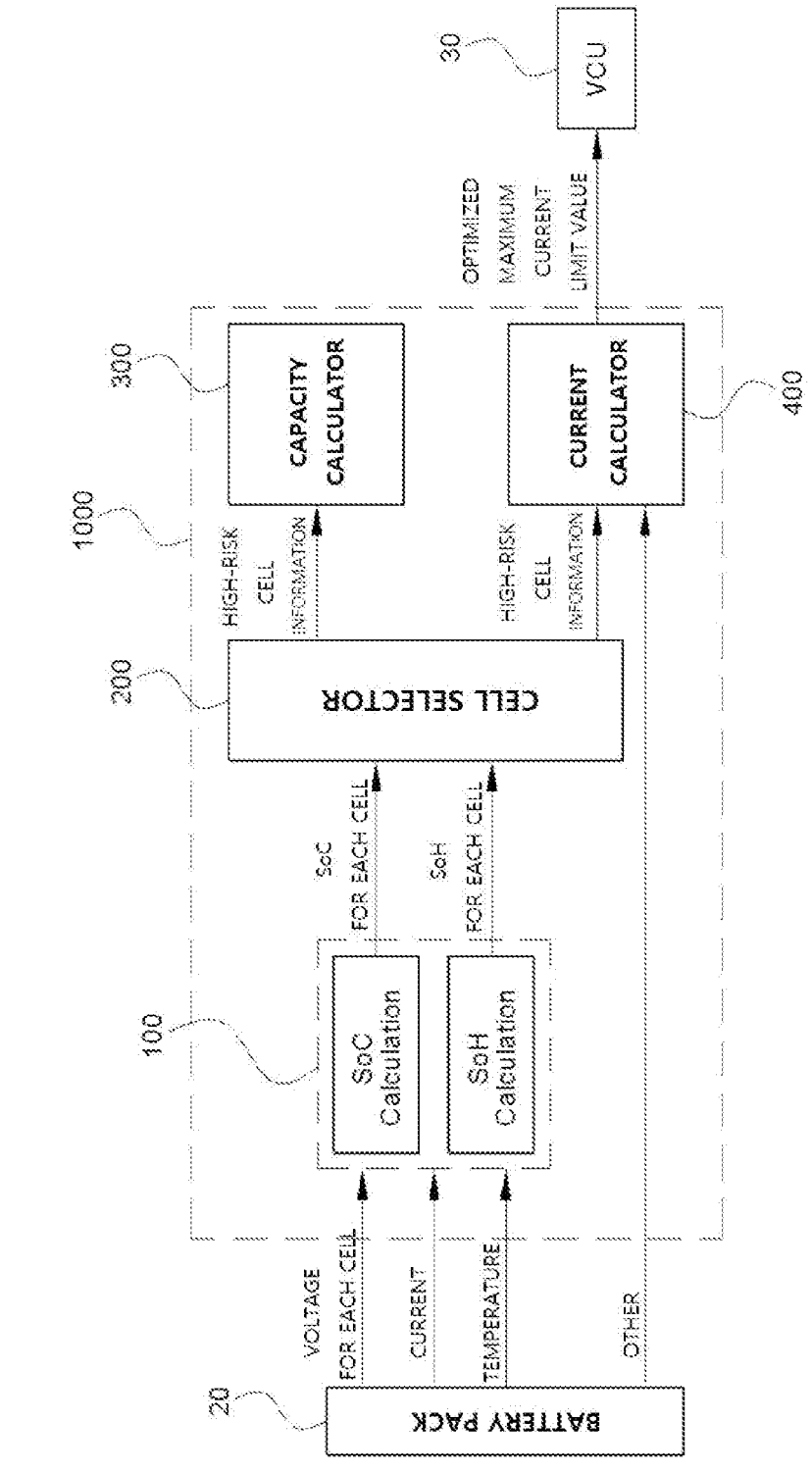
FIG. 3 is a diagram schematically illustrating a battery management system according to the present invention.

FIG. 3 is a diagram schematically illustrating a battery management system according to the present invention.

Referring to FIG. 3, a battery management system 1000 according to the present invention includes a state information calculator 100 and a cell selector 200.

Here, the state information calculator 100 may receive at least one of the temperature of the battery pack 20 or each of the battery cells measured from the battery pack 20, the voltage of each of the battery cells, and the current of the battery pack 20 to calculate at least one of the state of charge (SoC) and the state of health (SoH) of each of the battery cells as the state information. The state information of each of the battery cells thus calculated is transmitted to the cell selector 200 in order to select the high-risk battery cell.

At this time, the voltage, current, temperature, and the like are measured at predetermined time intervals.

Meanwhile, since a method for calculating SoC or SoH using the voltage, current, and temperature is a known technique, a detailed description thereof will be omitted in the present invention.

The cell selector 200 is a component that selects the high-risk battery cells using the state information of each of the battery cells received from the state information calculator 100.

More specifically, the cell selector 200 may select the high-risk battery cell using the state information of at least one of the SoC of each of the battery cells and the SoH of each of the battery cells at the current measurement time point.

Figure 4:
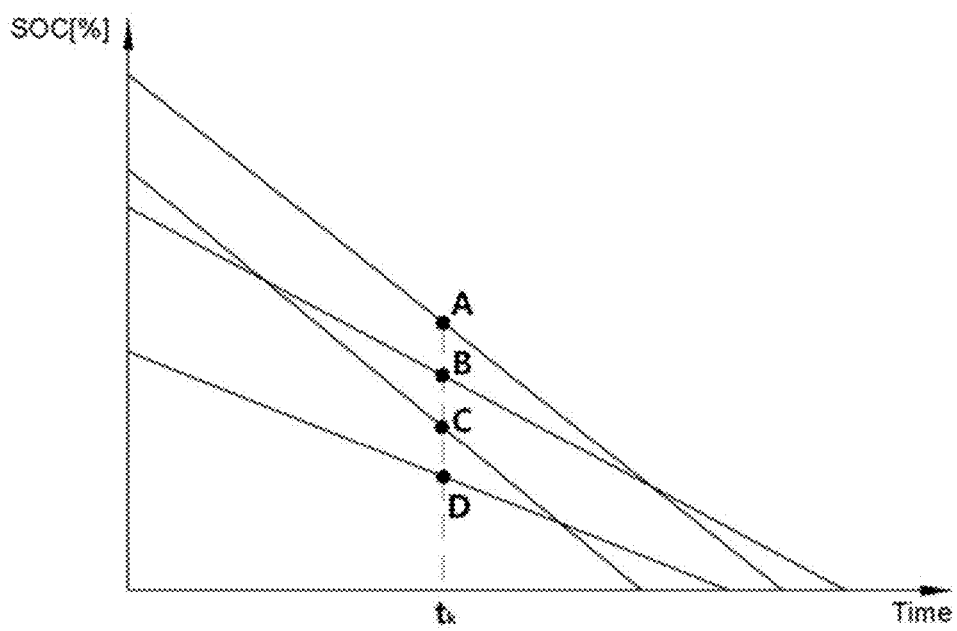
FIG. 4 is a diagram illustrating a change amount of SoC according to SoH of each of the battery cells.

FIG. 4 is a diagram illustrating a change amount of SoC according to SoH of each of the battery cells.

Referring to FIG. 4, the cell selector 200 may receive the SoC of each of the battery cells at a current measurement time point $t_k$ from the state information calculator 100, and apply a change amount of the SoC according to the SoH of each of the battery cells to the SoC of each of the battery cells, thereby selecting the high-risk battery cells.

For example, as a result of applying the change amount of the SoC according to the SoH of each of the battery cells to the SoC of each of the battery cells at the current measurement time point $t_k$, the cell selector 200 may select a battery cell that first reaches 100% SoC, that is, a battery cell to be fully charged first, as a high-risk battery cell.

Here, the meaning of applying the change amount of the SoC according to the SoH described above means that the SoH value of each of the battery cells is converted into a slope and applied as the change amount of SoC of the corresponding battery cell.

In order to describe in more detail, the following Equations 1 to 3 will be described.

The discharge capacity of the battery cell is shown in Equation 1 below.

$$\text{Discharge capacity of cell} = \int_0^t I(t)dt \qquad \text{[Equation 1]}$$

At this time, since the battery cells are connected in series, the same current is applied to all battery cells, and thus the discharge capacity of each of the battery cells is the same.

Meanwhile, SoC may be represented by Equation 2 below.

$$SoC = \frac{\text{Remaining capacity of cell}}{\text{Total capacity of cell}} =$$

$$\frac{\text{Initial capacity of cell} \times SoH - }{\text{Discharge capacity of cell}} \over {\text{Initial capacity of cell} \times SoH}} =$$

$$1 - \frac{\text{Discharge capacity of cell}}{\text{Initial capacity of cell} \times SoH}$$

[Equation 2]

Therefore, when a current I has a constant value, the function of the SoC over time satisfies Equation 3 below in relation to the SoH.

$$SoC(t) = 1 - \frac{I}{\text{Initial capacity of cell} \times SoH}t \qquad \text{[Equation 3]}$$

As a result, as a battery cell with a small SoH, a straight line graph representing the SoC over time has a steeper slope and reaches 100% SoC or 0% SoC first.

In the example of FIG. 4, it can be seen that cell A is a battery cell to be fully charged by reaching 100% SoC first. At this time, the cell selector 200 selects cell A as a high-risk battery cell.

On the contrary, when the representative SoC is selected based on a battery cell other than cell A among several battery cells having state deviations from each other, or an average value of SoC is selected as the representative SoC, if the cell A is charged first in the state in which other battery cells (cells B, C, and D) are not yet fully charged, the battery cells may be overcharged by exceeding the upper limit of the operating voltage, which is repeated and thus the cell A deteriorates, thereby adversely affecting the life of the entire battery pack.

Alternatively, as a result of applying the change amount of the SoC according to the SoH of each of the battery cells to the SoC of each of the battery cells at the current measurement time point $t_k$, the cell selector 200 may select a battery cell that first reaches 0% SoC, that is, a battery cell to be fully discharged first, as a high-risk battery cell.

In the example of FIG. 4, it can be seen that cell C is a battery cell to be fully charged by reaching 0% SoC first. At this time, the cell selector 200 selects cell C as a high-risk battery cell.

On the contrary, when the representative SoC is selected based on a battery cell other than cell C among several battery cells having state deviations from each other, or an average value of SoC is selected as the representative SoC, if the cell C is discharged first in the state in which other battery cells (cells A, B, and D) are not yet fully discharged, the battery cells may be overdischarged to the lower limit of the operating voltage, which is repeated and thus the cell C deteriorates, thereby adversely affecting the life of the entire battery pack.

Alternatively, the cell selector 200 may select a battery cell having the lowest SoH among the battery cells as a high-risk battery cell.

The reason of selecting the battery cells with low SoH as the high-risk battery cell is that the battery cells with low SoH may have undergone deterioration due to driving or have high internal resistance due to tolerances or defects at the time of manufacture, and the terminal voltage of the battery cell is highly likely to be out of the operating voltage when the battery cell is charged or discharged with the same current.

In the example of FIG. 4, since the cell C having the largest slope is a battery cell having the lowest SoH, the cell C is selected as a high-risk battery cell.

Meanwhile, the above-described operating voltage is a voltage range in which the battery cell may be stably charged and discharged without deteriorating. For example, the upper limit of the operating voltage may be predetermined as 4.2V (SoC 100%) and the lower limit may be predetermined as 2.7V (SoC 0%).

As described above, the cell selector 200 may select the high-risk battery cells and then provide information on the selected high-risk battery cells to the current calculator 400.

Meanwhile, the current calculator 400 may divide the change amount in the terminal voltage when it is assumed that the terminal voltage of the selected high-risk battery cell reaches the upper or lower limit of the operating voltage at the next measurement time point by the internal resistance of the high-risk battery cell to calculate the current limit value.

In addition, when there are two or more calculated high-risk battery cells, the current calculator 400 may calculate, as a final current limit value, the smallest of the current limit values calculated based on each high-risk battery cell.

At this time, since the current limit value is calculated using information on the high-risk battery cells among all battery cells, it is calculated as a more accurate value than when calculated through the selection of a representative value as in the related art. In addition, since the current limit value is calculated using only the information on the high-risk battery cell, not the information on all the battery cells, the calculation load does not increase significantly compared to the prior art.

Meanwhile, the battery management system 1000 of the present invention may further include a capacity calculator 300 that calculates an actual usable capacity of the battery pack.

Figure 5:
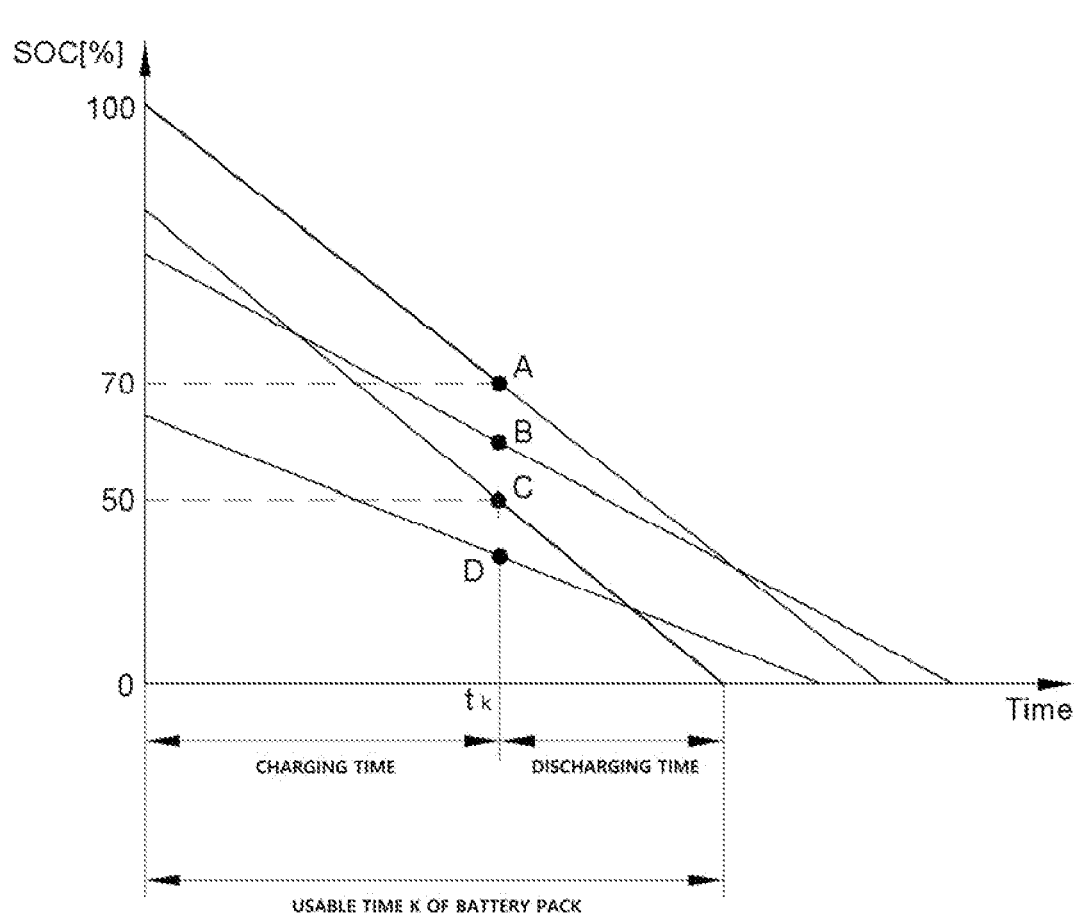
FIG. 5 is a diagram illustrating a method of calculating an actual usable capacity of a battery pack using a high-risk battery cell.

FIG. 5 is a diagram for explaining how the capacity calculator 300 calculates an actual usable capacity of a battery pack using a high-risk battery cell, which will be described below with further reference to FIG. 5.

Before calculating the actual usable capacity of the battery pack, the cell selector 200 may calculate a value K summed by calculating a time from the current measurement time point $t_k$ until the battery cell to be fully discharged first is fully discharged and a time from the current measurement time point $t_k$ until the battery cell to be fully charged first is fully charged when it is assumed that a current flows into through the selected high-risk battery cells at 1 C-rate based on the initial usable capacity of the battery cells.

Here, the time until the battery cell to be fully discharged first is fully discharged and the time until the battery cell to be fully charged first is fully charged are calculated using the SoC at the current measurement time point $t_k$ of the corresponding battery cells, respectively.

At this time, the C-rate is a discharge rate that means a current rate, and may be expressed as a charge/discharge current A of a battery cell/capacity Ah of a battery cell.

In other words, it means that when a battery cell with an initial usable capacity of 200 Ah is discharged at 1 C-rate, the battery cell may be used for 1 hour, and when the battery cell with an initial usable capacity of 200 Ah is discharged at 2 C-rate, the battery cell may be used for 0.5 hours.

For example, referring to FIG. 5, the cell C, which is the battery cell to be fully discharged first, has 50% SoC at the current measurement time point $t_k$, so the cell selector 200 may calculate, as 0.5*60 (hr)=0.5 hr, the time until the cell C is fully discharged when a current flows at 1 C-rate.

In addition, since the cell A, which is the battery cell to be fully charged first, has 70% SoC at the current measurement time point, the cell selector 200 may calculate, as 0.3*60 (hr)=0.3 hr, the time until the cell A is fully charged when a current flows at 1 C-rate.

The cell selector 200 may calculate K by summing the time thus calculated, and then calculate the representative SoH of the battery pack by applying Equation 4 below.

$$SoH_{pack} = K \times 100 \qquad \text{[Equation 4]}$$

At this time, $SoH_{pack}$ is a representative SoH of the battery pack, and the unit of K is time (hr).

Here, since K is a value calculated using the battery cell to be fully charged first and the battery cell to be fully discharged first among the battery cells, the representative SoH of a highly reliable battery pack may be obtained by using the K.

In the example of FIG. 5, K is calculated as 0.5+0.3=0.8, and the representative SoH of the battery pack is calculated as 80% through Equation 4 above.

By using the representative SoH of the battery pack thus calculated, the capacity calculator 300 may calculate the actual usable capacity of the battery pack through Equation 5 below.

$$CP_{pack} = SoH_{pack} \times CP_{BOL} \qquad \text{[Equation 5]}$$

Here, $CP_{pack}$ is the actual usable capacity of the battery pack, $SoH_{pack}$ is the representative SoH of the battery pack calculated by the cell selector 200, and $CP_{BOL}$ is the initial usable capacity of the battery cell.

In the example of FIG. 5, since the representative SoH of the battery pack is calculated as 80%, when the initial usable capacity ($CP_{BOL}$) of the battery cell is 200 Ah, the actual usable capacity of the battery pack is calculated as 160 Ah.

As described above, the battery management system of the present invention may select the high-risk battery cells that are highly likely to be out of the operating voltage range by applying the change amount according to the SoH for each of the battery cells to each SoC for each of the battery cells. Since the high-risk battery cells thus selected may be used as a reference battery cell for calculating the optimized battery pack current limit value, the current limit value may be accurately calculated and the stability of the battery pack may be improved.

In addition, according to the present invention, the battery management system may calculate the actual available capacity of the battery pack after calculating the representative SoH of the battery pack based on the selected high-risk battery cells.

In addition, in the battery management system according to the present invention, since the selected high-risk battery cells are battery cells that are likely to quickly deteriorate among the plurality of battery cells constituting the battery pack, the high-risk battery cells among all the battery cells included in the battery pack may be continuously managed as targets to be determined whether to be replaced first. That is, since the entire battery pack does not need to be replaced, the efficient maintenance and management of the battery pack is possible.

Figure 6:
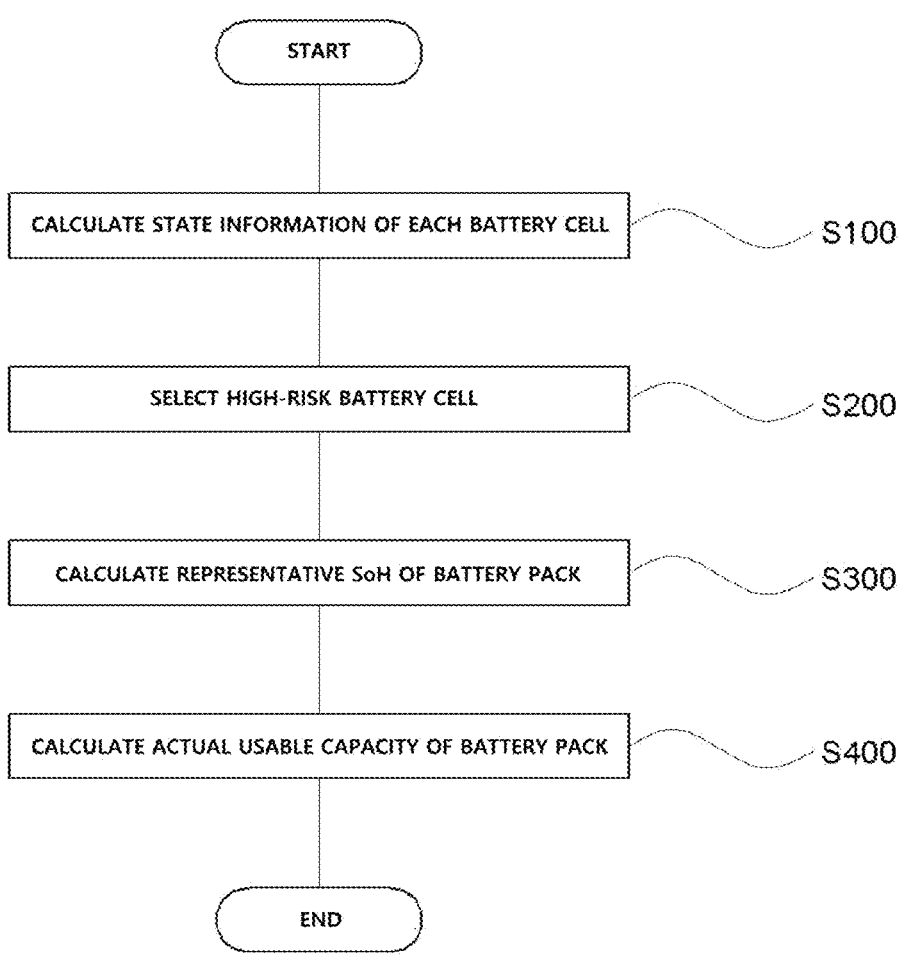
FIG. 6 is a flowchart illustrating a flow of a battery management method according to the present invention.

FIG. 6 is a flow chart illustrating a flow of a battery management method according to the present invention, and the battery management method according to the embodiment of the present invention may be performed by the battery management system 1000 described above.

Referring to FIG. 6, in the battery management method according to an exemplary embodiment of the present invention, first, the state information calculator 100 calculates state information of each of a plurality of battery cells (S100).

More specifically, in step (S100), the state information calculator 100 may receive at least one of the temperature of the battery pack 20 or each of the battery cells measured from the battery pack 20, the voltage of each of the battery cells, and the current of the battery pack 20 to calculate at least one of the state of charge (SoC) and the state of health (SoH) of each of the battery cells as the state information. The state information of each of the battery cells thus calculated is transmitted to the cell selector 200 in order to select the high-risk battery cell.

Next, the cell selector 200 selects a high-risk battery cell using the state information (S200).

At this time, in the step (S200), the cell selector 200 may select the high-risk battery cell using the state information of at least one of the SoC of each of the battery cells and the SoH of each of the battery cells at the current measurement time point.

More specifically, in the step (S200), the cell selector 200 may select the high-risk battery cell by applying the change amount of SoC according to the SoH of each of the battery cells to SoC of each of the battery cells at the current measurement time point.

Here, the cell selector 200 may select a battery cell to be fully charged first as the high-risk battery cell when applying the change amount of the SoC according to the SoH of each of the battery cells based on the SoC of each of the battery cells at the current measurement time point, and select a battery cell to be fully discharged first as the high-risk battery cell when applying the change amount of the SoC according to the SoH of each of the battery cells based on the SoC of each of the battery cells at the current measurement time point.

Meanwhile, the battery management method according to the present invention may further include a step (S300) of calculating a representative SoH of the battery pack by applying the above Equation 4 to K which is a summed value of a time from the current measurement time point until the battery cell to be fully discharged first is fully discharged and a time from the current measurement time point until the battery cell to be fully charged first is fully charged, if a current flows into the selected high-risk battery cell at 1 C-rate based on the initial usable capacity of the battery cells, after selecting the high-risk battery cell (S200).

At this time, the step (S300) may be performed in the cell selector 200 of the battery management system 1000.

In addition, the cell selector 200 may calculate the time until the battery cell to be fully discharged first is fully discharged and the time until the battery cell to be fully charged first is fully charged using the SoC at the current measurement time point of the corresponding battery cells, respectively.

Meanwhile, the battery management method of the present invention may further include calculating the actual usable capacity of the battery pack through Equation 5 (S400) after calculating the representative SoH of the battery pack (S300).

At this time, the step (S400) may be performed in the capacity calculator 300 of the battery management system 1000.

In addition, a more detailed description of the battery management method of the present invention may be replaced by the above description of the battery management system 1000 according to the present invention.

As described above, the battery management method of the present invention may select the high-risk battery cells that are highly likely to be out of the operating voltage range by applying the change amount according to the SoH for each battery cell to each SoC for each battery cell. Since the high-risk battery cells thus selected may be used as a reference battery cell for calculating the optimized battery pack current limit value, the current limit value may be accurately calculated and the stability of the battery pack may be improved.

In addition, the battery management method according to the present invention may calculate the actual available capacity of the battery pack after calculating the representative SoH of the battery pack based on the selected high-risk battery cells.

In addition, in the battery management method according to the present invention, since the selected high-risk battery cells are battery cells that are likely to quickly deteriorate among the plurality of battery cells constituting the battery pack, the high-risk battery cells among all the battery cells included in the battery pack may be continuously managed as targets to be determined whether to be replaced first. That is, since the entire battery pack does not need to be replaced, the efficient maintenance and management of the battery pack is possible.

Although the present disclosure has been described with reference to the exemplary embodiments and the accompanying drawings, the present disclosure is not limited to the above-mentioned exemplary embodiments, but may be variously modified and changed from the above description by those skilled in the art to which the present disclosure pertains. Therefore, the scope and spirit of the present invention should be understood only by the following claims, and all of the equivalences and equivalent modifications to the claims are intended to fall within the scope and spirit of the present invention.

What is claimed is:

1. A battery management system for selecting a high-risk battery cell, from a plurality of battery cells in a battery pack, that has a risk that a terminal voltage during charging or a terminal voltage during discharging is out of an operating voltage, the battery management system comprising:

a state information calculator that calculates state information of each of the plurality of battery cells; and a cell selector that selects the high-risk battery cell using the state information, wherein the state information calculated by the state information calculator includes at least one of a state of charge (SoC) or a state of health (SoH), and the cell selector selects the high-risk battery cell by using the state information of at least one of the SoC of each of the plurality of battery cells or the SoH of each of the plurality of battery cells;

the high-risk battery cell is selected according to the SoH of each of the plurality of battery cells to the SoC of each of the plurality of battery cells; and and the cell selector selects a battery cell having the lowest SoH among the plurality of battery cells as the high-risk battery cell.

2. A battery management system for selecting a high-risk battery cell from a plurality of battery cells in a battery pack, that has a risk that a terminal voltage during charging or a terminal voltage during discharging is out of an operating voltage the battery management system comprising:

a state information calculator that calculates state information of each of the plurality of battery cells, and a cell selector that selects the high-risk battery cell using the state information, wherein the state information calculated by the state information calculator includes at least one of a state of charge (SoC) or a state of health (SoH), and the cell selector selects the high-risk battery cell by using the state information of at least one of the SoC of each of the plurality of battery cells or the SoH of each of the plurality of battery cells;

the high-risk battery cell is selected according to the SoH of each of the plurality of battery cells to the SoC of each of the plurality of battery cells;

the cell selector selects the high-risk battery cell by applying a change amount of the SoC according to the SoH of each of the plurality of battery cells to the SoC of each of the plurality of battery cells at a current measurement time point; and the cell selector selects a battery cell to be fully charged first as the high-risk battery cell when applying the change amount of the SoC according to the SoH of each of the plurality of battery cells based on the SoC of each of the plurality of battery cells at the current measurement time point, and selects a battery cell to be fully discharged first as the high-risk battery cell when applying the change amount of the SoC according to the SoH of each of the plurality of battery cells based on the SoC of each of the plurality of battery cells at the current measurement time point.

3. A battery management method using a battery management system for selecting a high-risk battery cell, from a plurality of battery cells in a battery pack, that has a risk that a terminal voltage during charging or a terminal voltage during discharging is out of an operating voltage, the battery management method comprising:

calculating state information of each of the plurality of battery cells; and selecting the high-risk battery cell using the state information, wherein the state information includes at least one or SoC or SoH, and the high-risk battery cell is selected by using the state information of at least one of the SoC of each of the plurality of battery cells or the SoH of each of the plurality of battery cells in the selecting of the high-risk battery cell, the high-risk battery cell is selected according to the SoH of each of the plurality of battery cells to the SoC of each of the plurality of battery cells, and in the selecting of the high-risk battery cell, a battery cell having a lowest SoH among the plurality of battery cells is selected as the high-risk battery cell.

4. A battery management method using a battery management system for selecting a high-risk battery cell, from a plurality of battery cells in a battery pack, that has a risk that a terminal voltage during charging or a terminal voltage during discharging is out of an operating voltage, the battery management method comprising:

calculating state information of each of the plurality of battery cells; and selecting the high-risk battery cell using the state information, wherein the state information includes at least one of SoC or SoH, and the high-risk battery cell is selected by using the state information of at least one of the SoC of each of the plurality of battery cells or the SoH of each of the plurality of battery cells in the selecting of the high-risk battery cell, the high-risk battery cell is selected according to the SoH of each of the plurality of battery cells to the SoC of each of the plurality of battery cells, the high-risk battery cell is selected by applying a change amount of the SoC according to the SoH of each of the plurality of battery cells to the SoC of each of the plurality of battery cells at a current measurement time point, and in the selecting of the high-risk battery cell, a battery cell to be fully charged first is selected as the high-risk battery cell when applying the change amount of the SoC according to the SoH of each of the plurality of battery cells based on the SoC of each of the plurality of battery cells at the current measurement time point, and a battery cell to be fully discharged first is selected as the high-risk battery cell when applying the change amount of the SoC according to the SoH of each of the plurality of battery cells based on the SOC of each of the plurality of battery cells at the current measurement time point.

* * * * *